United States Patent [19]
Konno

[11] Patent Number: 5,508,663
[45] Date of Patent: Apr. 16, 1996

[54] PULSE WIDTH MODULATION AMPLIFIER

[75] Inventor: Fumiyasu Konno, Hirakata, Japan

[73] Assignee: Matsushita Electric Industrial Co., Ltd., Osaka, Japan

[21] Appl. No.: 309,185

[22] Filed: Sep. 20, 1994

[30] Foreign Application Priority Data

Sep. 21, 1993 [JP] Japan .................................. 5-234521

[51] Int. Cl.⁶ ............................. H03F 1/134; H03F 3/38
[52] U.S. Cl. ............................ 330/10; 330/107; 330/260; 330/294
[58] Field of Search ............................. 330/10, 107, 109, 330/259, 260, 294

[56] References Cited

U.S. PATENT DOCUMENTS 4,673,889  6/1987  Cini et al. ................................. 330/10
4,987,381  1/1991  Butler ................................. 330/260 X

OTHER PUBLICATIONS

Sierra, "Active RC Filters Without Inductors", *IBM Technical Disclosure Bulletin*, vol. 15, No. 6, Nov. 1972 pp. 1788, 1789.

*Primary Examiner*—James B. Mullins
*Attorney, Agent, or Firm*—Willian Brinks Hofer Gilson & Lione

[57] ABSTRACT

In a pulse width modulation amplifier use for audio devices, an input side of an operational amplifier of a pulse width modulation amplifier is used as an alternating current amplifier by grounding its negative terminal through a series circuit formed with a resistor and a capacitor. The direct current gain of the operational amplifier becomes 1, and the offset voltage decreases to the inherent offset voltage of the operational amplifier. The operational amplifier has no direct current coupling with next amplifying stage and hence, the offset voltage is not increased after leaving the operational amplifier. Also, the pulse width modulation amplifier includes negative feedback circuits connecting a final output stage to the input of the operational amplifier including a low-pass filter, each low-pass filter having a grounded capacitor, wherein the negative feedback signal is transmitted through another capacitor to the input of the operational amplifier to provide an alternating current coupling to reduce the influence of the carrier and its higher harmonics and other noises leaked to the operational amplifier through the feedback circuit.

7 Claims, 4 Drawing Sheets

PULSE WIDTH MODULATION AMPLIFIER

BACKGROUND OF THE INVENTION

The present invention relates to a pulse width modulation amplifier used for amplifying the output power of acoustic reproduction audio devices, wherein the output offset voltage and output noise are reduced.

The conversion efficiency of pulse width modulation amplifiers is higher than that of typical class A, AB, and B amplifiers. For example, the conversion efficiency of a class B amplifier, which is generally characterized as having good conversion efficiency, is around 70%. On the other hand, the conversion efficiency of a pulse width modulation amplifier can be 85–90%. Accordingly, pulse width modulation amplifiers are widely used as low frequency amplifiers in audio devices in vehicles or in public address systems.

An example of a conventional pulse width modulation amplifier is illustrated by the block diagram shown in FIG. 4. The pulse width modulation amplifier comprises an operational amplifier, used as a direct current amplifier, a pair of feedback circuits 2 and 3, a triangular wave oscillator 4, a comparator 5, an output stage driving circuit 6, a final output stage 7, low-pass filters 8, and a load 9.

A pulse width modulation signal is generated by the comparator 5 by comparing an input signal amplified by the operation amplifier 1 with a triangular wave signal generated by the triangular wave oscillator 4. The pulse width modulation signal is amplified by the output stage driving circuit 6 to drive the final output stage 7. The output of the final output stage 7 is demodulated, removing the carrier wave and higher harmonic by the low-pass filters 8, resulting in a low frequency output signal supplied to a load 9.

Field-effect transistors ("FETs") are used in the output stage driving circuit 6 and the final output stage 7 since, compared with transistors, FETs have a low driving current and exhibit a low resistance when turned on. The FETs in the final output stage 7 are generally connected in a H-bridge configuration.

A pair of negative feedback loops are provided between the final output stage 7 and the operational amplifier 1, for improving the distortion factor, noise, etc. in an audio circuit.

In these conventional pulse width modulation amplifiers, the carrier of the same frequency (hereinafter carrier) as the oscillation frequency of the triangular wave oscillator 4 must be eliminated before the signal from the final output stage 7 is negatively fed back to the operational amplifier. Low-pass filters are included in the feedback circuits 2 and 3 to eliminate the carrier.

The details of the circuit elements around the operational amplifier are shown in FIG. 5. The operational amplifier 1 comprises a direct current-differential amplifier, capacitors 11,13 and 15 and resistors 12,14,16 and 17.

An input signal is applied to the input terminal 10, passed through a capacitor 11 and a resistor 12, and applied to the non-inverting (positive) input of the operational amplifier 1. Signals from the output stage 7 are fed back to the non-inverting (positive) and the inverting (negative) inputs through the feedback circuits 2 and 3. The capacitors 13 and 15 limit the high frequency so that high frequency is not applied to the operational amplifier from the feedback circuits 2 and 3. Frequencies higher than a cut-off frequency Fc are not negatively fed back. The cut-off frequency Fc is generally around 20 kHz. The cut-off frequency is determined according to the time constant ($\frac{1}{2\pi}$ CR) when C is the capacitance of capacitor 13 or 15 and R is the resistance (not shown in FIG. 5) of the feedback circuits 2 and 3.

The feedback circuits 2 and 3 are shown in detail in FIG. 6. The circuit shown in FIG. 6 is essentially the same as the circuit shown in FIG. 5 in that the circuit includes operation amplifier 1 as a direct current-differential amplifier, capacitors 13 and 15 and resistors 12,14,16 and 17. The carrier and the higher harmonics in the signals fed back from the output stage 7 are removed by a pair of low-pass filters. One low-pass filter is formed by a resistor 19 and a capacitor 20. The other low-pass filter is formed by a capacitor 22 and a resistor 23. After passing through the low-pass filters the signals are fed through the resistors 18 and 21 to the positive and negative inputs, respectively, of the operation amplifier 1.

The ground points of the capacitors 13,20 and 22 and the resistors 14 and 17 operate at a voltage potential of ½ Vcc.

In order for the conventional pulse width modulation amplifier described above to have good characteristics, the magnitude of amplification of the operational amplifier 1 would have to be increased to increase the magnitude of the negative feedback signals. However, since the operational amplifier 1 is a direct current amplifier, an increase in the amplification magnitude may generate an offset voltage, which is a deviation of the center voltage of the alternating signal to be amplified from the center voltage of the power source. Also, in the case of direct current amplification, direct current coupling is used for coupling to the next amplification stage. Thus, the offset voltage is transmitted to the next amplification stage, resulting in a significantly high offset voltage. The disadvantage of direct current amplification is that the generation of such an offset voltage may cause some harm and may be an inefficient use of a power source.

Another disadvantage of using direct current amplification is that the offset voltage cannot be corrected sufficiently by the operational amplifier. In particular, the low-pass filters in the negative feedback circuits 2 and 3 are direct-coupled to the operational amplifier 1. The offset voltage of the amplification stage after the comparator 5 is also applied to the operational amplifier. As a result, the operational amplifier cannot provide sufficient correction to the offset voltage.

A further disadvantage is attributable to the amount of noise in the signal of the conventional circuit described above. Noise may increase in such a circuit because the capacitors 13,20 and 22 and the resistors 14 and 17 are at the same common ground potential and the negative feedback circuits are direct-current-coupled to the operational amplifier 1. In such a configuration, the carrier of the output signal may leak to the operational amplifier.

A still further disadvantage of the conventional circuit is that the frequency of the carrier of the conventional pulse width modulation amplifier shown in FIG. 6 is higher than the audible range (for example 63 kHz). Moreover, the signals fed back from the output stage 7 include switching noise, introduced by the FET circuit 7 of the final output stage, and result in worse noise characteristics for the whole circuit.

The output noise characteristics of the conventional pulse width modulation amplifier with no input signal are shown in FIG. 7. Since the input voltage is 0, only the residual noise of the amplifier is analyzed. The plot in FIG. 7 is a frequency analysis of the voltage at the final output stage (both sides of the load 9 in FIG. 4) of the pulse width modulation amplifier shown in FIG. 4, including the operational amplifier 1 and negative feedback circuits shown in FIG. 6. It should be apparent that the noise in the output signal includes higher harmonic components and fractional harmonic components of the carrier, their complex, mixed, or modulated components, and the basic oscillation frequency 63 kHz. The audible range is also affected. The reason why these noise components are not eliminated by the low-pass filters in FIG. 6 is because the capacitors of the low-pass filters are grounded to the point of ½ Vcc due to the direct current coupling of the negative feedback circuits. To avoid noise, this point must be a perfect ground point. However, the impedance of the capacitor 13 of the power source filter, for example, is not actually infinitesimally small. Accordingly, the noise component generated at the final output stage is applied to the operational amplifier through the impedance of the power source and amplified.

SUMMARY OF THE INVENTION

An object of the present invention is to provide a pulse width modulation amplifier having excellent characteristics such as a small offset voltage and low output noise at the final output stage.

According to the invention, a pulse width modulation amplifier is provided that reduces the offset voltage and decreases the output noise.

The pulse width modulation amplifier comprises, an operational amplifier having an input signal applied to one of its terminals, a comparator for comparing the output of said operational amplifier and the output of a triangular wave oscillator, an output stage driving circuit connected to the output of said comparator, a final output stage connected to the output of said output stage driving circuit, a filter connected to the output of said final output stage for demodulating the signal from the output stage, a load connected to said filter, and negative feedback circuits for performing negative-feedback from two output terminals of said final output stage to two input terminals of said operational amplifier, respectively, wherein one end of a resistor, connected to the terminal of said operational amplifier not having and input signal applied thereto, is grounded through a capacitor so as to operate said operational amplifier as an alternating current amplifier.

In another embodiment, the pulse width modulation amplifier of the present invention comprises, an operation amplifier having an input signal applied to one of its terminals, a comparator for comparing the output of said operational amplifier and the output of a triangular wave oscillator, an output stage driving circuit connected to the output of said comparator, a final output stage connected to the output of said output stage driving circuit, a filter connected to the output of said final output stage for demodulating the signal from said final output stage, a load connected to said filter, and negative feedback circuits for performing negative-feedback from two output terminals of said final output stage to two input terminals of said operational amplifier respectively, wherein each of said negative feedback circuits includes a low-pass filter, with one end of a capacitor of a resistor-capacitor circuit constituting each low-pass filter being grounded, and the negative feedback being applied from the connecting point of the resistor-capacitor circuit to the input of said operational amplifier through a coupling capacitor, so that said feedback circuits and said operational amplifier have an alternating current coupling.

The advantage of using the primary stage of an operational amplifier as an alternating current amplifier is that the offset voltage of the final output stage is decreased. Further, by employing alternating current coupling between the feedback circuit and the operational amplifier, the output noise is decreased.

DETAILED DESCRIPTION OF THE EMBODIMENTS

Figure 1:
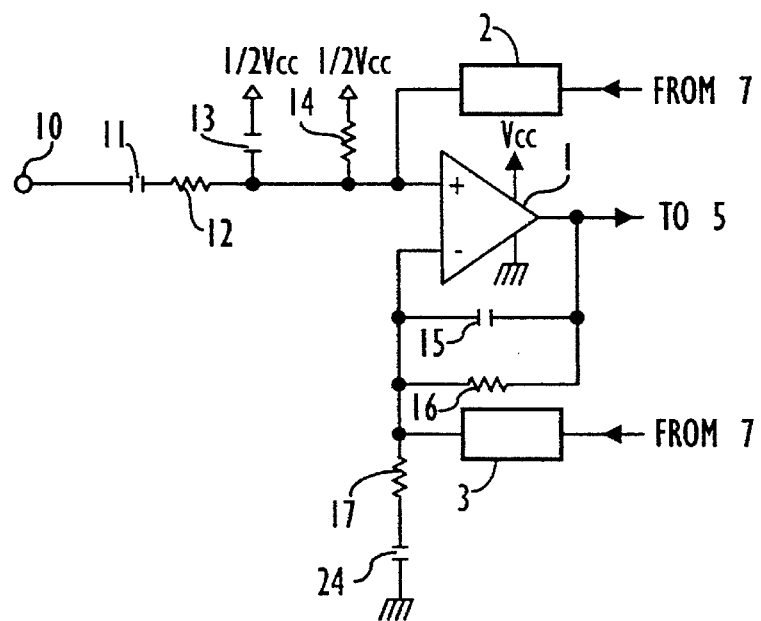
FIG. 1 is a circuit diagram showing the input portion of a pulse width modulation amplifier of the first embodiment of the present invention.
Figure 2:
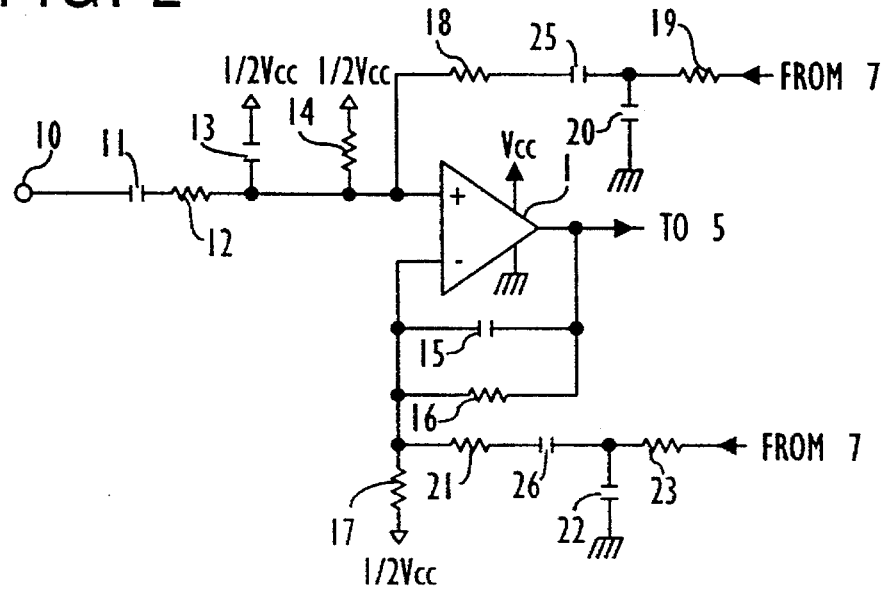
FIG. 2 is a circuit diagram showing the input portion and the negative feedback circuits of a pulse width modulation amplifier of the second embodiment of the present invention.
Figure 4:
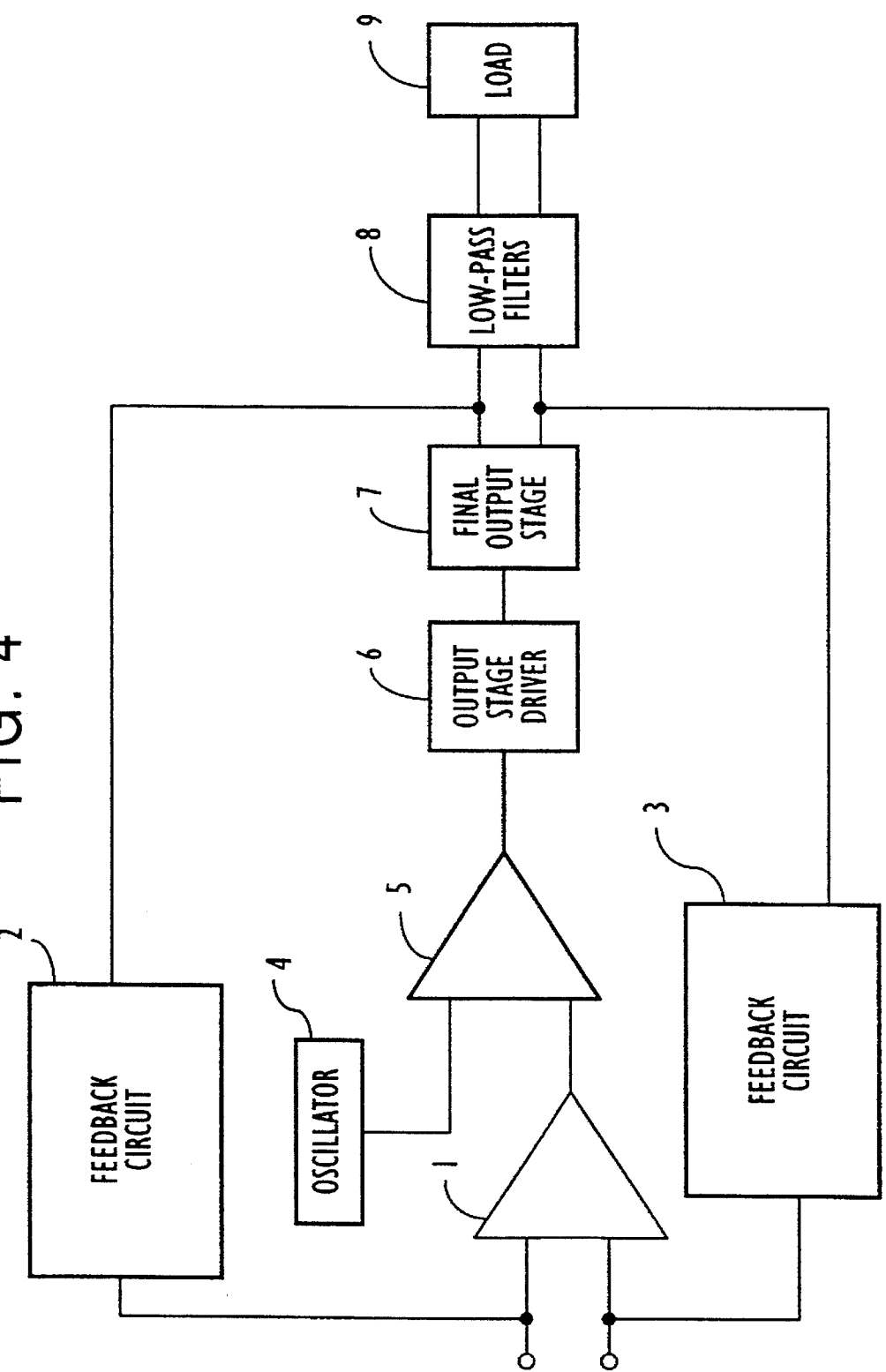
FIG. 4 is a block diagram showing a conventional pulse width modulation amplifier.
Figure 5:
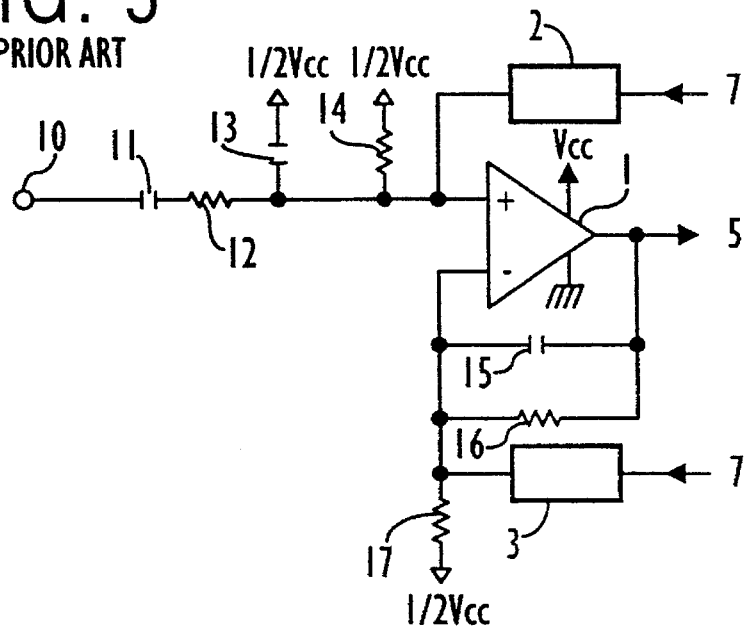
FIG. 5 is a circuit diagram showing the input portion of a conventional pulse width modulation amplifier.
Figure 6:
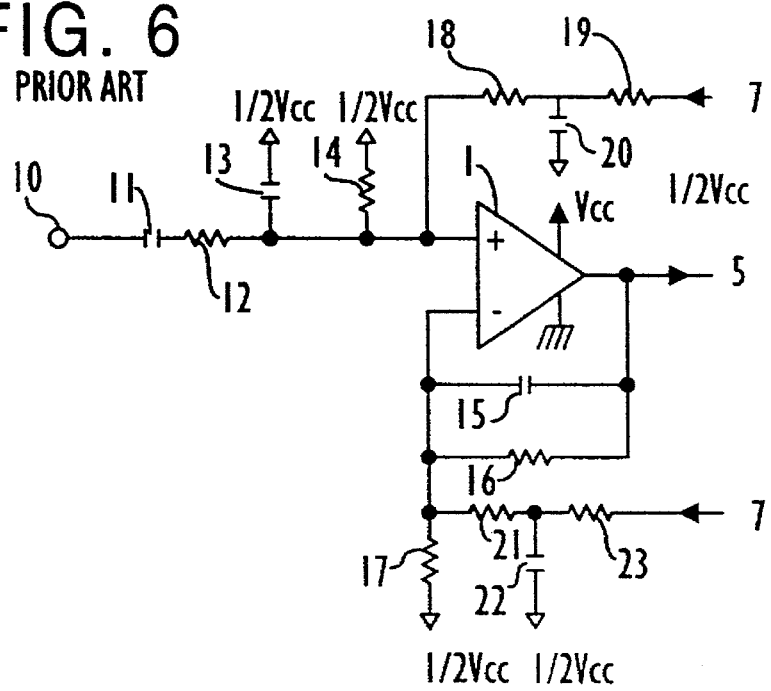
FIG. 6 is a circuit diagram showing the input portion and the negative feedback circuits of a conventional pulse width modulation amplifier.

Hereafter, a pulse width modulation amplifier of the present invention will be described by referring to FIGS. 1, 2, and 3. In FIGS. 1 and 2, the elements having the same function as the elements of the conventional pulse width modulation amplifier, shown in FIGS. 4, 5 and 6, are identified with the same numbers. Their description is omitted.

First Embodiment

A pulse width modulation amplifier of a first embodiment of the present invention is described referring to FIG. 1. The circuit diagram in FIG. 1 shows the input portion of a pulse width modulation amplifier of the first embodiment of the present invention. FIG. 1 differs from the circuit shown in FIG. 5 in that the resistor 17 is not connected to the center voltage (½)Vcc, but is connected to ground through a capacitor 24. In this circuit, the operational amplifier 1 becomes an alternating current amplifier, and when the frequency is low, the capacitor 24(C) and the resistor 17(R) act as a high pass filter having a cut off frequency of Fc, where $Fc=\frac{1}{2\pi} CR$ [Hz]. The characteristics of the operational amplifier 1, operating as an alternating current amplifier, are that the frequency characteristic decreases below Fc, the amplifying magnitude decreases, and the gain becomes 1 at direct current.

Accordingly, the offset voltage is decreased independently of the gain of the operational amplifier to the inherent offset voltage of the operational amplifier itself. Since the operational amplifier has no direct current coupling with next amplification stage, the amplifier does not influence the offset voltage of the next amplification stage, resulting in a reduced offset voltage in the final output stage.

Second Embodiment

A pulse width modulation amplifier of a second embodiment of the present invention is described by referring to FIG. 2. The circuit diagram in FIG. 2 shows the input portion and the negative feedback circuits of a pulse width modulation amplifier of the second embodiment of the present invention. FIG. 2 differs from the circuit shown in FIG. 6 in that capacitors 20 and 22 of the low-pass filters constituting the negative feedback circuits are directly connected to ground. As a result, feedback signals are fed back to the operational amplifier 1 after the direct current in the feedback signals is cut off by the coupling capacitors 25 and 26. In this circuit, the coupling for negative feedback between the primary stage of the operational amplifier 1 and the negative feedback circuit from the final output stage is not a direct current coupling but an alternating current coupling.

Accordingly, by employing alternating current coupling between the feedback circuit and the operational amplifier, the output noise is decreased.

Figure 3:
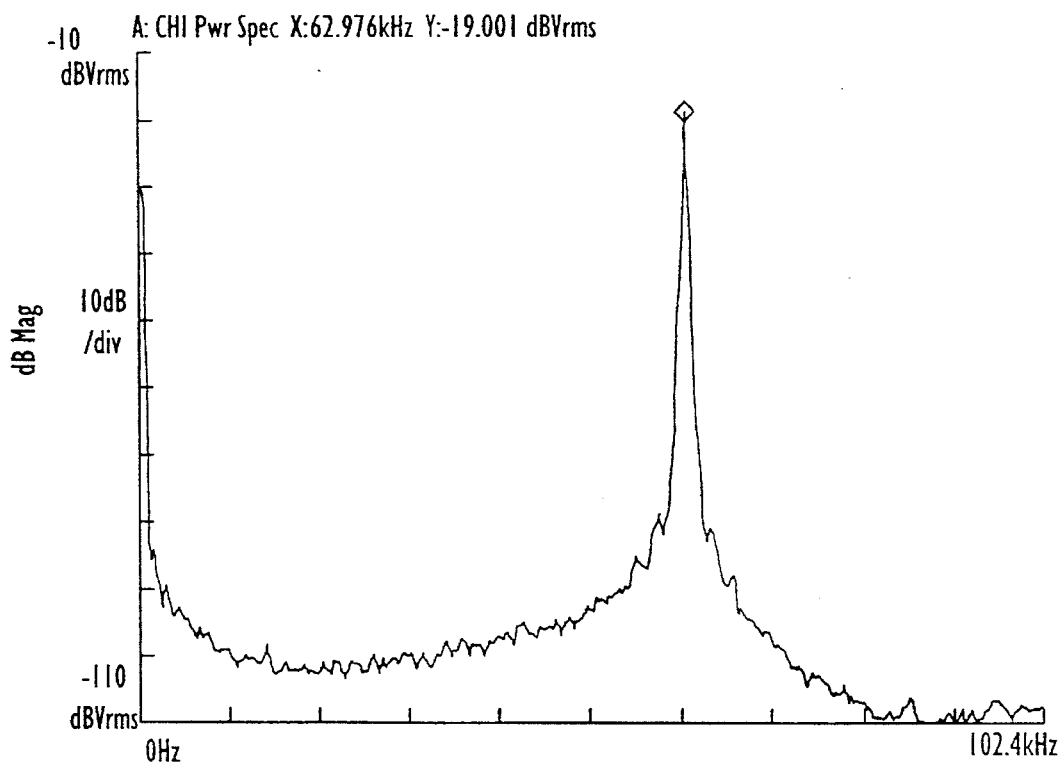
FIG. 3 is a plot of the output characteristics of a pulse width modulation amplifier of the second embodiment of the present invention with no input signal.
Figure 7:
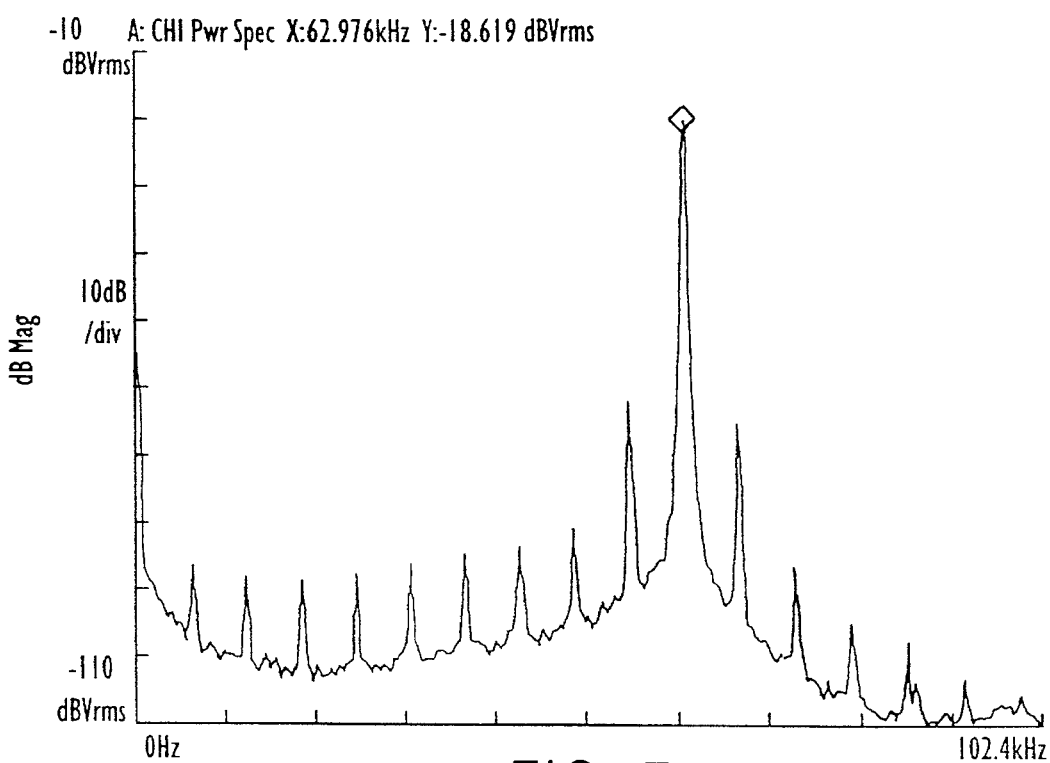
FIG. 7 is a plot of the output characteristics of a conventional pulse width modulation amplifier with no signal input.

The output noise characteristics of the pulse width modulation amplifier of the present invention with no input signal is shown in FIG. 3. It should be apparent that the pulse width modulation amplifier has excellent characteristics with little leakage of its higher harmonics components and fractional harmonics noise components, except for the fundamental frequency of the carrier. These excellent characteristics are due to the change of the negative feedback circuits from direct current coupling to alternating current coupling, by directly grounding capacitors 20 and 22, so that the influence of the residual power source impedance is avoided. Thus, the noise generated in the final output stage is not transmitted through power source impedance to the operational amplifier and amplified.

By making the primary stage operational amplifier an alternating current amplifier, the coupling with the next amplification stage becomes an alternating coupling, providing the advantage of reducing the offset voltage of the final output stage. Further, by providing an alternating coupling between the negative feedback circuits and the operational amplifier, additional advantages are provided in that the direct current component can be cut off and the influence of power source impedance eliminated so that the output noise can be decreased.

Of course, it should be understood that a wide range of changes and modifications can be made to the embodiments described above. It is therefore intended that the foregoing detailed description be regarded as illustrative rather than limiting and that it be understood that it is the following claims, including all equivalents, which are intended to define the scope of the invention.

What is claimed is:

1. A pulse width modulation amplifier comprising:

an operational amplifier having a pair of input terminals, one of said terminals for applying an input signal thereto; and negative feedback circuits for providing negative-feedback signals to the two input terminals of said operational amplifier, respectively, each of said negative feedback circuits including a low-pass filter having a capacitor and a resistor, with one end of said resistor for receiving a negative feedback signal and the other end coupled to one end of said capacitor, the other end of said capacitor coupled to ground, and a further capacitor coupling the connecting point between said capacitor and said resistor to an input of said operational amplifier for providing an alternating current coupling to said operational amplifier to reduce the output noise of the pulse width modulation amplifier.

2. A pulse width modulation amplifier comprising:

an operational amplifier having a pair of input terminals, one of said terminals for applying an input signal thereto;

a triangular wave oscillator;

a comparator for comparing the output of said operational amplifier and the output of said triangular wave oscillator;

an output stage driving circuit connected to the output of said comparator;

a final output stage connected to the output of said output stage driving circuit, said final output stage having a pair of output terminals;

a filter connected to the output of said final output stage for demodulating the signal from said final output stage;

a load connected to said filter;

negative feedback circuits for providing negative-feedback signals from the two output terminals of said final output stage to the two input terminals of said operational amplifier, respectively; and a resistor and a capacitor connected in series, said resistor having one end connected to the other terminal of said operational amplifier input terminals, said capacitor having one end coupled to ground for operating said operational amplifier as an alternating current amplifier to reduce the offset voltage of the pulse width modulation amplifier.

3. The pulse width modulation amplifier according to claim 2, wherein, field-effect transistors are used as amplification devices in said output stage driving circuit and said final output stage.

4. The pulse width modulation amplifier according to claim 2, wherein, field effect transistors are connected in an H-bridge configuration in said final output stage.

5. A pulse width modulation amplifier comprising:

an operational amplifier having a pair of input terminals, one of said input terminals for applying an input signal thereto;

a triangular wave oscillator;

a comparator for comparing the output of said operational amplifier and the output of said triangular wave oscillator;

an output stage driving circuit connected to the output of said comparator;

a final output stage connected to the output of said output stage driving circuit said final output stage having a pair of output terminals;

a filter connected to the output of said final output stage for demodulating a signal from said final output stage;

a load connected to said filter;

negative feedback circuits for providing negative-feedback signals from the two output terminals of said final output stage to the two input terminals of said operational amplifier, respectively, each of said negative feedback circuits including a low-pass filter having a capacitor and a resistor, with one end of said resistor coupled to a said output terminal and the other end coupled to one end of said capacitor, the other end of said capacitor coupled to ground, and a further capacitor coupling the connecting point between said capacitor and said resistor to an input of said operational amplifier for providing an alternating current coupling to said operational amplifier to reduce the output noise of the pulse width modulation amplifier.

6. The pulse width modulation amplifier according to claim 5, wherein, field-effect transistors are used as amplification devices in said output stage driving circuit and said final output stage.

7. The pulse width modulation amplifier according to claim 5, wherein, field-effect transistors are connected in an H-bridge configuration in said final output stage.

* * * * *